(12) United States Patent
Asozu et al.

(10) Patent No.: US 10,571,767 B2
(45) Date of Patent: Feb. 25, 2020

(54) LIQUID CRYSTAL DISPLAY DEVICE

(71) Applicant: Japan Display Inc., Tokyo (JP)

(72) Inventors: Genki Asozu, Tokyo (JP); Shigesumi Araki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/792,927

(22) Filed: Oct. 25, 2017

(65) Prior Publication Data
US 2018/0149938 A1    May 31, 2018

(30) Foreign Application Priority Data
Nov. 25, 2016 (JP) ................ 2016-228971

(51) Int. Cl.
| G02F 1/1362 | (2006.01) |
| G02F 1/1333 | (2006.01) |
| G02F 1/1343 | (2006.01) |
| H01L 27/12 | (2006.01) |
| G02F 1/1337 | (2006.01) |
| G02F 1/1368 | (2006.01) |

(Continued)

(52) U.S. Cl.
CPC ...... *G02F 1/136227* (2013.01); *G02F 1/1362* (2013.01); *G02F 1/133345* (2013.01); *G02F 1/134309* (2013.01); *G02F 1/136286* (2013.01); *H01L 27/1214* (2013.01); *G02F 1/136213* (2013.01); *G02F 2001/13685* (2013.01); *G02F 2001/133357* (2013.01); *G02F 2001/133776* (2013.01); *G02F 2001/134372* (2013.01); *G09G 3/3677* (2013.01); *G09G 3/3696* (2013.01); *H01L 29/786* (2013.01)

(58) Field of Classification Search
CPC ............. G02F 1/1362; G02F 1/136227; G02F 1/136213; G02F 1/134309
See application file for complete search history.

(56) References Cited

U.S. PATENT DOCUMENTS

| 2009/0268145 A1 | 10/2009 | Anjo et al. |
| 2014/0307190 A1 | 10/2014 | Tomikawa |

(Continued)

FOREIGN PATENT DOCUMENTS

| JP | H08328042 A | 12/1996 |
| JP | 2009-265484 A | 11/2009 |
| JP | 2014-206622 A | 10/2014 |

*Primary Examiner* — Dung T Nguyen
(74) *Attorney, Agent, or Firm* — Michael Best & Friedrich LLP

(57) ABSTRACT

The structure of the invention is: a pair of a first scanning line and a second scanning line extend in a first direction on the TFT substrate, a first pixel that has a first pixel electrode and a second pixel that as a second pixel electrode are formed between the pairs of the scanning lines, a connection area is formed between the first scanning line and the second scanning line; a first TFT, a first through hole that connects the first TFT with the first pixel electrode, and a second TFT, a second through hole that connects the second TFT with the second pixel electrode are formed in the connection area; the first pixel electrode and the second pixel electrode are formed on an organic passivation film; the organic passivation film is not formed in an area where the first through hole and the second through hole are formed.

10 Claims, 15 Drawing Sheets

(51) Int. Cl.
  *H01L 29/786* (2006.01)
  *G09G 3/36* (2006.01)

(56) References Cited

U.S. PATENT DOCUMENTS

| | | | |
|---|---|---|---|
| 2015/0301418 A1* | 10/2015 | Ono | H01L 27/124 349/143 |
| 2017/0192322 A1* | 7/2017 | Jung | G02F 1/133345 |
| 2018/0231820 A1* | 8/2018 | Qu | G02F 1/133345 |
| 2018/0323216 A1* | 11/2018 | Jiang | G02F 1/1368 |

* cited by examiner

FIG. 9
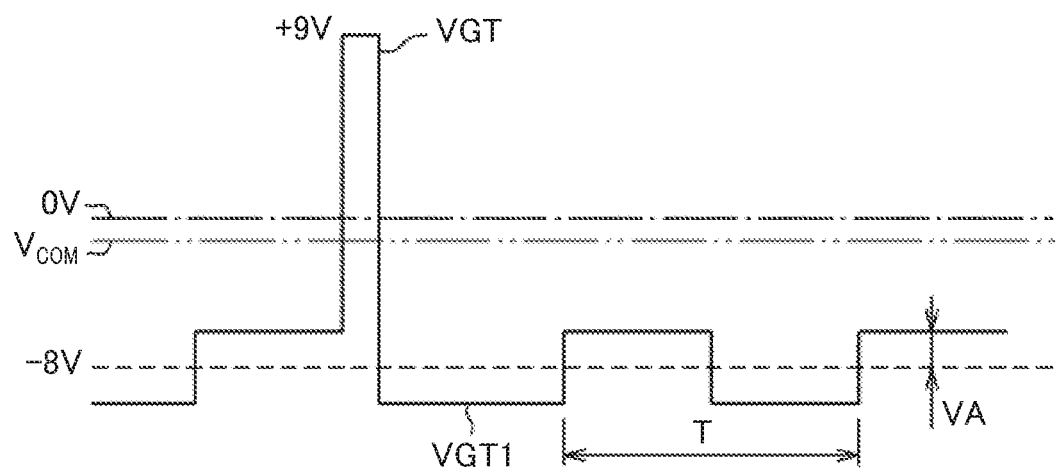
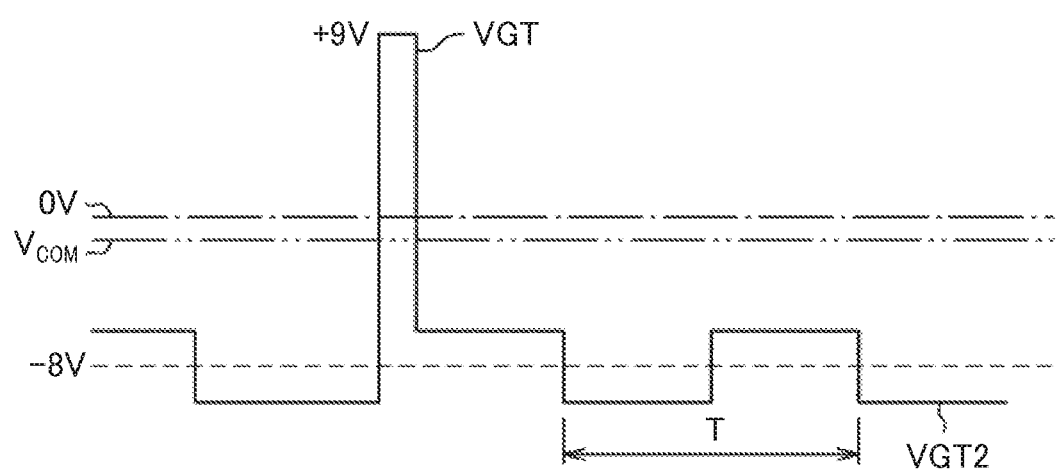

LIQUID CRYSTAL DISPLAY DEVICE

CLAIM OF PRIORITY

The present application claims priority from Japanese Patent Application JP 2016-228971 filed on Nov. 25, 2016, the content of which is hereby incorporated by reference into this application.

BACKGROUND OF THE INVENTION

(1) Field of the Invention

The present invention relates to a liquid crystal display device that measures display unevenness due to ion aggregation.

(2) Description of the Related Art

A liquid crystal display device comprises a TFT substrate where thin film transistors (TFT) and pixel electrodes are formed and a counter substrate opposing to the TFT substrate, wherein a liquid crystal layer is sandwiched between the TFT substrate and the counter substrate. Images are formed by controlling the transmittance of light in each of pixels.

Impurities exist in the liquid crystal; the impurities tend to be ionized. Ions move in certain direction and aggregate at a certain area. If ions gather in certain area, electrical resistance of the liquid crystal in that area decreases, which causes formation of a black stain when images are displayed.

Patent document 1 (Japanese patent laid open No. 2014-206622) discloses to form a dummy electrode at the outside of the display area, and to apply a certain voltage to the dummy electrode to maintain ions in the area outside of the display area. Patent document 2 (Japanese patent laid open No. 2009-265484) discloses to form a shield electrode at the outside of the display area of the TFT substrate to suppress the influence of the gate voltage from the leads of the scanning lines to the periphery of the display area. Patent document 3 (Japanese patent laid open No. Hei 8-328042) discloses to form a shield electrode to cover the scanning line driving circuit, which is built in in the liquid crystal display panel, to suppress the influence of DC voltage in the scanning line driving circuit to the display area.

SUMMARY OF THE INVENTION

In a liquid crystal display panel, a large screen is required without enlarging the outer dimension of the display panel. Consequently, a frame width, which is a distance from an edge of the display area and an edge of the display panel, becomes narrower. In this case, ions, which gathered in the frame, overflow into the display area; that tends to be a cause of a black stain.

In addition, when a width of the frame becomes narrower, a voltage applied to the ion trap electrode influences to the display area; thus, causes a deterioration of a display quality.

The purpose of the present invention is to solve the above described problem; namely, to prevent a black stain caused by a decrease of resistance of the liquid crystal due to ions gathered in a certain area.

The present invention solves the above problem; the concrete measures are as follows:

(1) A liquid crystal display device comprising: a TFT substrate and a counter substrate are adhered by a seal formed in a periphery of the TFT substrate and the counter substrate, a liquid crystal layer is sandwiched between the TFT substrate and the counter substrate, and a display area; a pair of a first scanning line and a second scanning line extend in a first direction on the TFT substrate, a first pixel that has a first pixel electrode and a second pixel that as a second pixel electrode are formed between the pairs of the scanning lines, a connection area is formed between the first scanning line and the second scanning line; a first TFT, a first through hole that connects the first TFT with the first pixel electrode, and a second TFT, a second through hole that connects the second TFT with the second pixel electrode are formed in the connection area; the first pixel electrode and the second pixel electrode are formed on an organic passivation film; the organic passivation film is not formed in an area where the first through hole and the second through hole are formed.

(2) The liquid crystal display device according to (1), wherein an AC voltage of reverse phase superimposed on a DC voltage is applied to the first scanning line and the second scanning line.

(3) A liquid crystal display device comprising:
a TFT substrate and a counter substrate are adhered by a seal formed in a periphery of the TFT substrate and the counter substrate, a liquid crystal layer is sandwiched between the TFT substrate and the counter substrate, and a display area; a pair of a first scanning line and a second scanning line extend in a first direction on the TFT substrate, a first pixel that has a first pixel electrode and a second pixel that as a second pixel electrode are formed between the pairs of the scanning lines, a connection area, which controls the first pixel and the second pixel, is formed between the first scanning line and the second scanning line; a first TFT, a first through hole that connects the first TFT with the first pixel electrode, and a second TFT, a second through hole that connects the second TFT with the second pixel electrode are formed in the connection area; the first pixel electrode and the second pixel electrode are formed on an organic passivation film of a first thickness; the first through hole and the second through hole are formed in an organic passivation film of a second thickness, the second thickness is less than the first thickness.

(4) The liquid crystal display device according to (3), wherein an AC voltage of reverse phase superimposed on a DC voltage is applied to the first scanning line and the second scanning line.

BRIEF DESCRIPTION OF THE DRAWINGS

FIG. 9 is an example of a gate voltage according to the present invention;

DETAILED DESCRIPTION OF THE PREFERRED EMBODIMENTS

Before explaining concrete embodiments of the present invention, a behavior of ions dissolved in the liquid crystal is explained. Ions in the liquid crystal tend to be positively charged. The liquid crystal is driven by a voltage between the pixel electrode and the common electrode. Ions are gathered in a certain direction influenced by e.g. shapes of the pixel electrodes.

Figure 15:
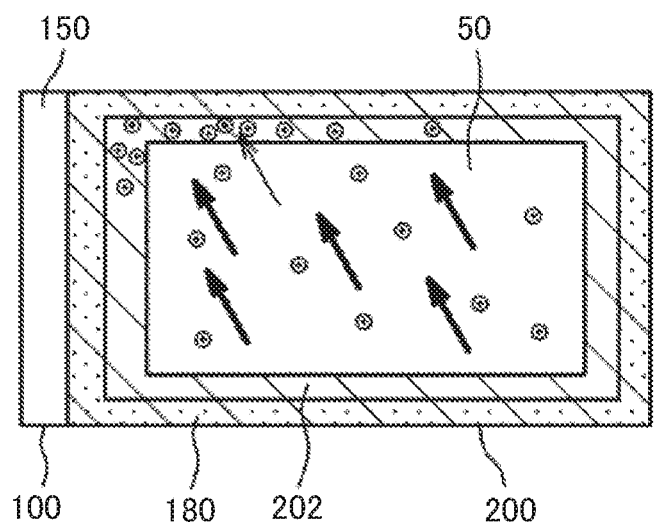
FIG. 15 is a plan view that shows a problem of the conventional liquid crystal display device.
Figure 16:
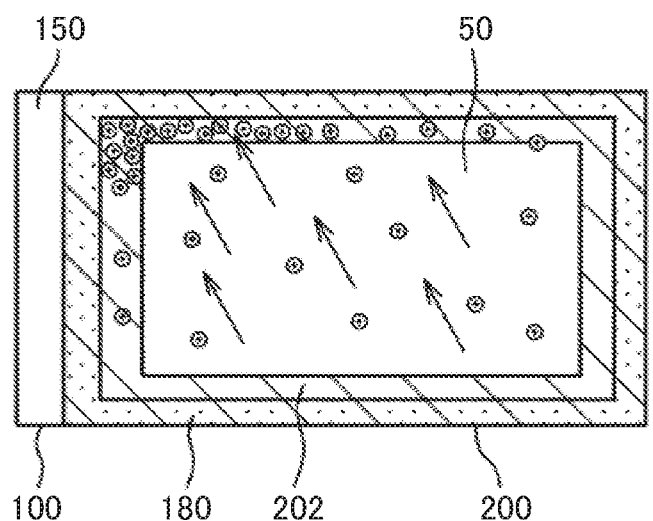
FIG. 16 is another plan view that shows a problem of the conventional liquid crystal display device.

FIG. 15 is a plan view that shows movement of ions. In FIG. 15, the liquid crystal is sandwiched between the TFT substrate 100 and the counter substrate 200. FIG. 15 shows ions are gathered to an upper left side. Ions tend to be gathered in a certain direction of the screen according to e.g. a shape of the pixel electrode. In FIG. 15, the light shielding film 202 is formed inside of the seal material 180; ions are gathered under the light shielding film 202. FIG. 16 shows more ions are gathered according to time passage. In FIG. 16, however, ions still exist outside of the display area, namely, under the light shielding area; thus, image display is not influenced by ions.

Figure 17:
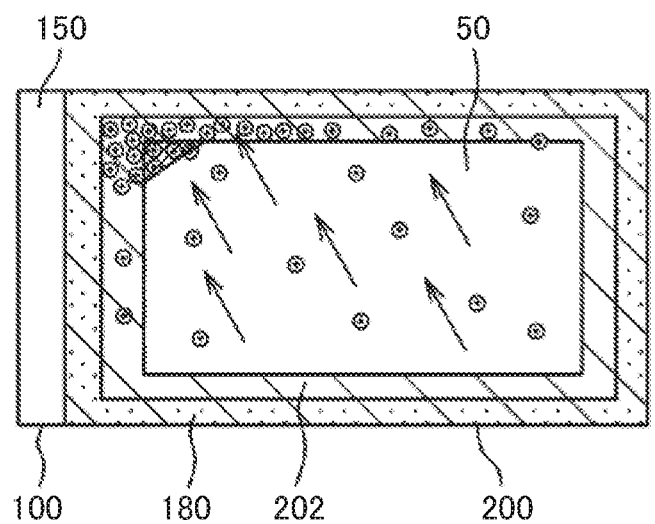
FIG. 17 is yet another plan view that shows a problem of the conventional liquid crystal display device.

FIG. 17 shows, with further time passage, more ions gather at the upper left of the display; thus, ions cannot stay under the light shielding film 202; consequently ions overflow into the display area 50. FIG. 17 shows the black stain is generated in the upper left of the display area where ions overflow.

This overflow of ions in the periphery of the display area occurs more frequently according the width of the frame becomes narrower. The purpose of the present invention is to countermeasure the problem of the black stain. In other words, the black stain is formed at the area where electric resistance of the liquid crystal becomes lower caused by gathering of ions; thus, the purpose of the present invention is to realize the structure to prevent the ions from gathering in a certain area. Another purpose of the present invention is to increase brightness of the screen by increasing the light transmittance of the liquid crystal display device.

First Embodiment

Figure 1:
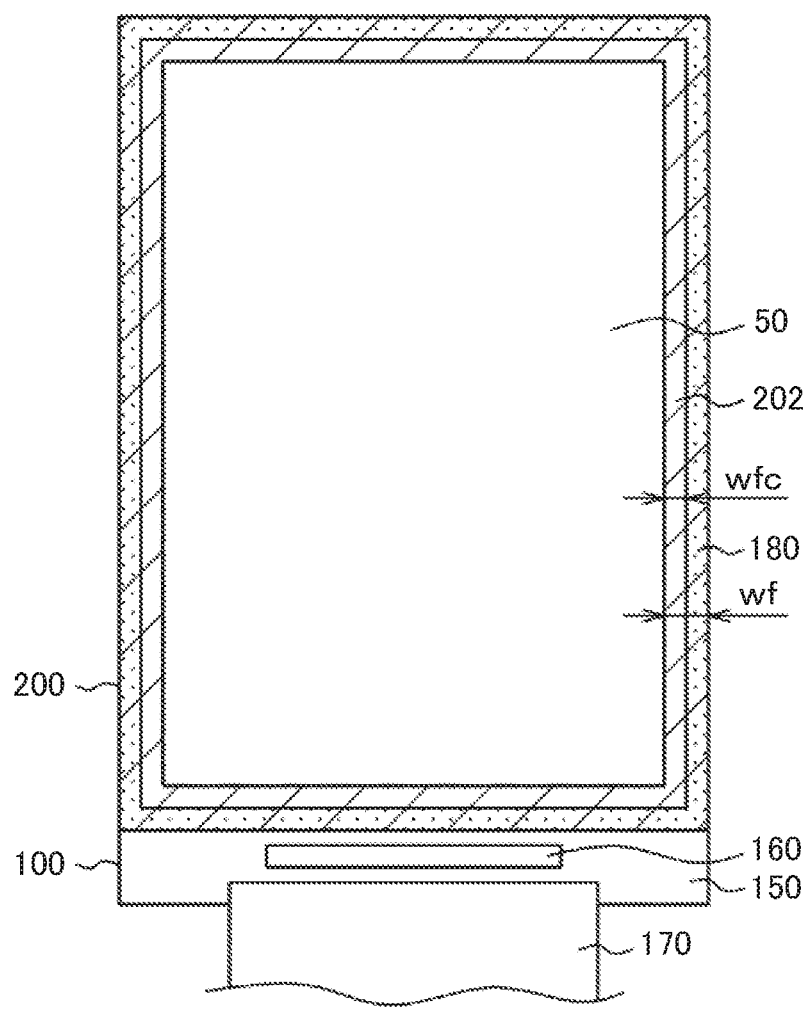
FIG. 1 is a plan view of the liquid crystal display device that the present invention is applied.

FIG. 1 is a plan view of the liquid crystal display panel, which is used in a cellar phone, as an example that the present invention is applied. In FIG. 1, the TFT substrate 100 and the counter substrate 200 are adhered at the periphery with the seal material 180; the liquid crystal is sandwiched by the TFT substrate 100 and the counter substrate 200. The TFT substrate 100 is made bigger than the counter substrate 200, the portion of the TFT substrate 100 that doesn't overlap with the counter substrate 200 is a terminal area 150.

The driver IC 160 is installed in the terminal area and the flexible wiring substrate 170 is connected to the terminal area 150.

In FIG. 1, the area outside the display are 50 is a frame area where light shielding film by the black matrix 202 is formed. The seal material 180 is formed under the black matrix 202. Recently, the frame width, a distance between the edge of the display area and the edge of the liquid crystal display panel, has become narrower. For example, the frame width wf on the long side of the liquid crystal display device is 0.5 mm or less. Besides, the width wfc that is a distance between the edge of the display area 50 and the edge of the seal material 180 becomes as narrow as 0.1 mm. According to the width wfc become narrower, ions gathered in the periphery easily influences to the display area 50.

On the other hand, according to the high definition of the screen advances, a transmittance of the screen relatively decreases. In each of the pixels, the TFT or the through hole for the connection is formed. In this area, the alignment of the liquid crystal is disturbed; consequently, a leak of light occurs. To prevent the leak of light, the black matrix is formed on the counter substrate to shield back light. According to high definition of the screen advances, however, a size of the pixel becomes smaller, thus, a ratio of the shielded area becomes relatively high. Thus, a transmittance of light in the pixel decreases, namely, a brightness of the screen decreases.

Figure 2:
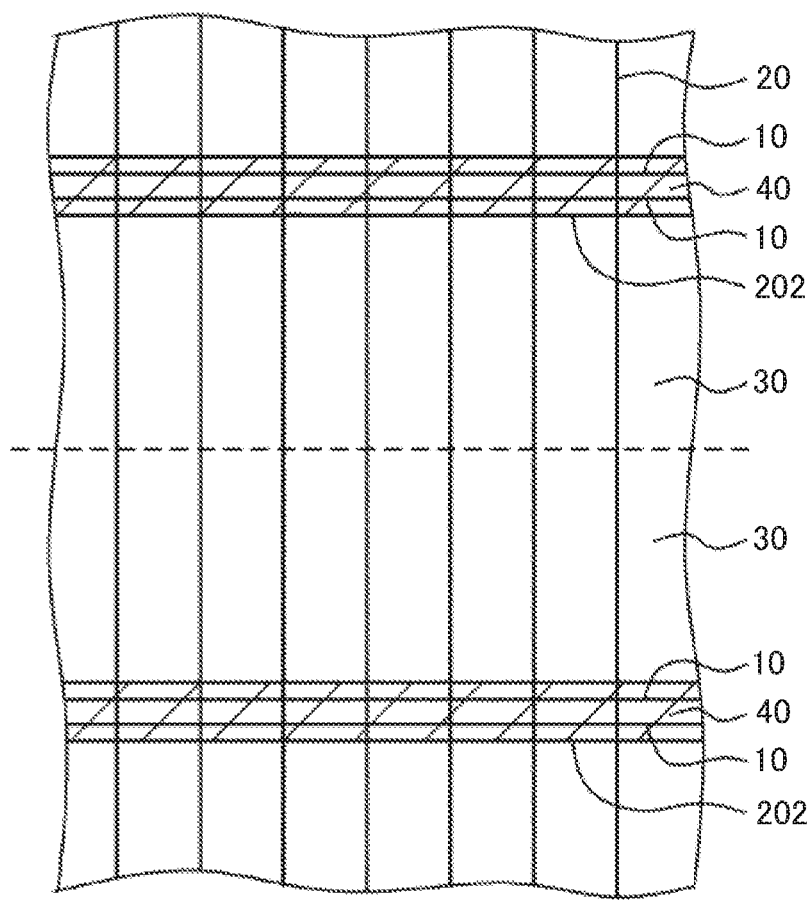
FIG. 2 is a plan view of the pixel configuration in the display area according to the present invention.

In the present invention, by taking the pixel structure in the display area as described in FIG. 2, enables to decrease the light shielding area by the black matrix and, thus, suppress the decrease of the screen brightness. In FIG. 2, a pair of scanning lines 10, separated by certain distance, extend in lateral direction, and are arranged in longitudinal direction. The video signal lines 20 extend in longitudinal direction and arranged in lateral direction.

The feature of FIG. 2 is that two pixels 30 are formed in longitudinal direction between a pair of the scanning lines 10. In a pair of the scanning lines, the upper scanning line controls the upper pixel 30 and the lower scanning line 10 controls the lower pixel 30. TFTs and through holes that controls signals for the upper pixels and the lower pixel are gathered in one place, thus, only this place is to be shielded by the black matrix. Thus, a decrease of the brightness of the screen can be suppressed. The area between the scanning lines 10 of the pair is called a connection area in this specification.

FIG. 2 is a plan view that shows this structure that the black matrix 202 extends in lateral direction to cover the area sandwiched between the scanning lines 10 of the pair. In the conventional structure, the black matrix 202 is formed in stripe shape in each of the pixel row; on the contrary, in the present invention, the black matrix 202 is formed in stripe shape in every other pixel rows. Thus, a transmittance of the liquid crystal display panel is increased.

Figure 3:
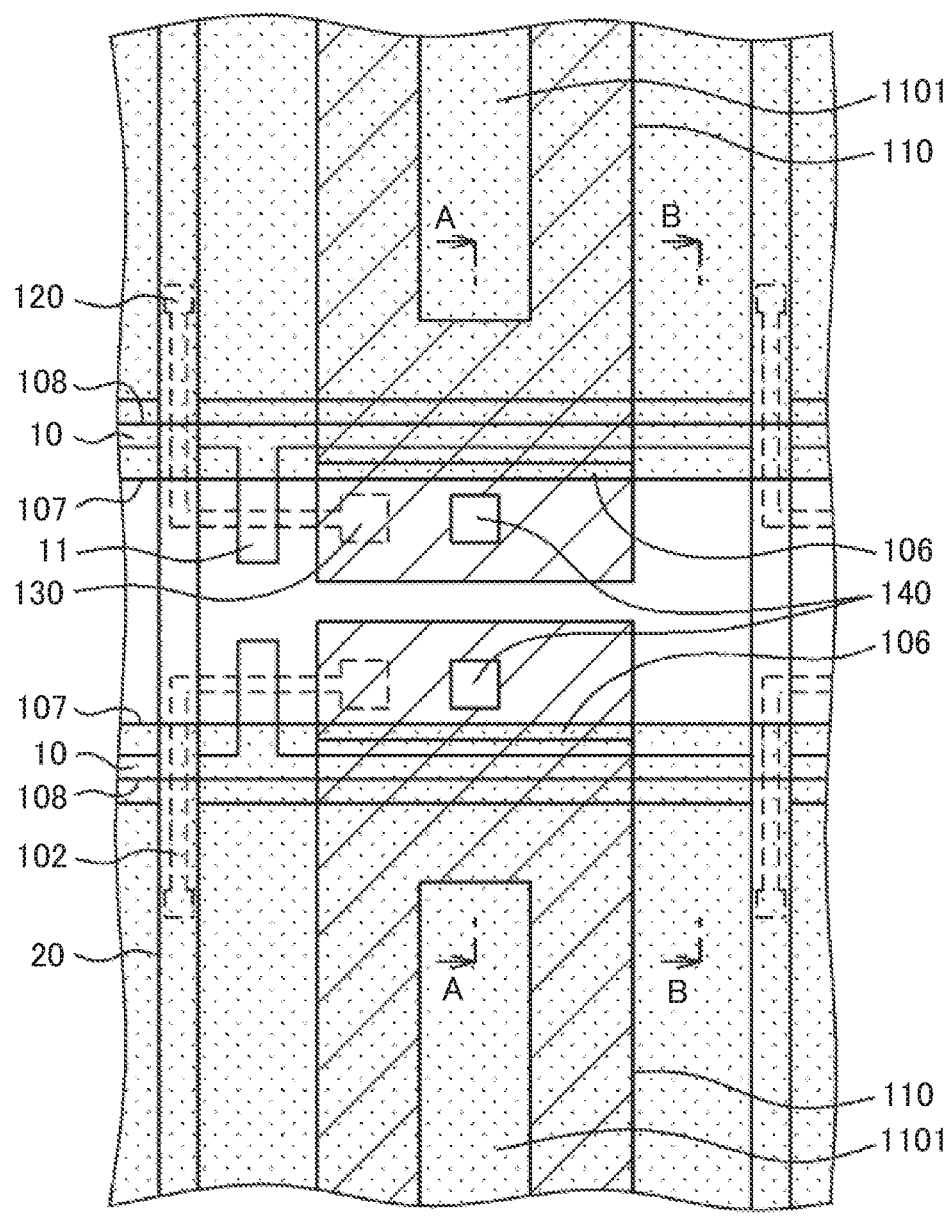
FIG. 3 is a plan view of the pixel structure of the liquid crystal display device according to the present invention.

FIG. 3 is a detailed plan view in the vicinity of the pair of the scanning lines 10. FIG. 3 is the structure of IPS (In Plane Switching) type liquid crystal display device. In FIG. 3, a pair of the first scanning line 10 and the second scanning line 10 extend in lateral direction. The first pixel having a first pixel electrode 110 is located at the upper side of the first scanning line 10; the second pixel having a second pixel electrode 110 is located at the lower side of the second scanning line 10. Namely, the first TFT for the first pixel and the first through hole 140 to connect the first TFT and the first pixel electrode 110, and, the second TFT for the second pixel and the second through hole 140 to connect the second TFT and the second pixel electrode 110 are all formed in the area between the first scanning line 10 and the second scanning line 10.

The area between the first scanning line 10 and the second scanning line 10, where the TFTs and through holes are formed, is covered by the stripe shaped black matrix that is formed on the counter substrate and extends in lateral direction. The black matrix that extends in lateral direction is formed one per two pixel rows; thus, a transmittance of the liquid crystal display panel increases compared to the conventional one.

In FIG. 3, the first pixel electrode 110 in the first pixel goes over the first scanning line 10 and extends to the first through hole 140; the second pixel electrode 110 in the second pixel goes over the second scanning line 10 and extends to the second through hole 140. FIG. 3 is an IPS type liquid crystal display device where the capacitance insulating film 109 is formed on the common electrode 108 that is formed in solid plane, and the comb shaped pixel electrode 110 is formed on the capacitance insulating film 109. The common electrode 108 is formed on the organic passivation film 107 which works also as a flattening layer.

Another feature of the present invention shown in FIG. 3 is that the organic passivation film 107 is formed in the pixel area, however, the organic passivation film 107 doesn't exist in the area where the first through hole 140 exists in the connection area. In FIG. 3, the organic passivation film 107 in the upper pixel is eliminated shortly after it goes beyond the first scanning line 10; the organic passivation film 107 in the lower pixel is eliminated shortly after it goes beyond the second scanning line 10, The organic passivation film 107 has roles as a flattening layer and as a layer to decrease the floating capacitance; thus, it is made as thick as 2-5 μm. Therefore, a diameter of the through hole in the organic passivation film 107 becomes big. Since the area of the through hole must be light shielded, a transmittance decreases when the diameter of the through hole becomes big. In this invention, the organic passivation film 107 is eliminated from the connection area; thus, a diameter of the through hole 140 formed in the connection area can made be small. Consequently, the width of the connection area can be narrower; therefore, a transmittance of the liquid crystal display panel can be increased.

In FIG. 3, the semiconductor layer 102 is formed between the through hole 120 and the through hole 140. The semiconductor layer 102 connects with the video signal line 20 at the through hole 120, extends under the video signal line 20 and crosses under the scanning line 10. The first TFT is formed at this stage. After that, the semiconductor layer 102 bends and extends to the through hole 130 formed in the connection area to connect with the contact electrode 106. The semiconductor layer 102 crosses under the branch of the scanning line 10 before the connection with the contact electrode 106; at this stage, the second TFT is formed. The contact electrode 106 connects with the pixel electrode 110 through the through hole 140.

Figure 4:
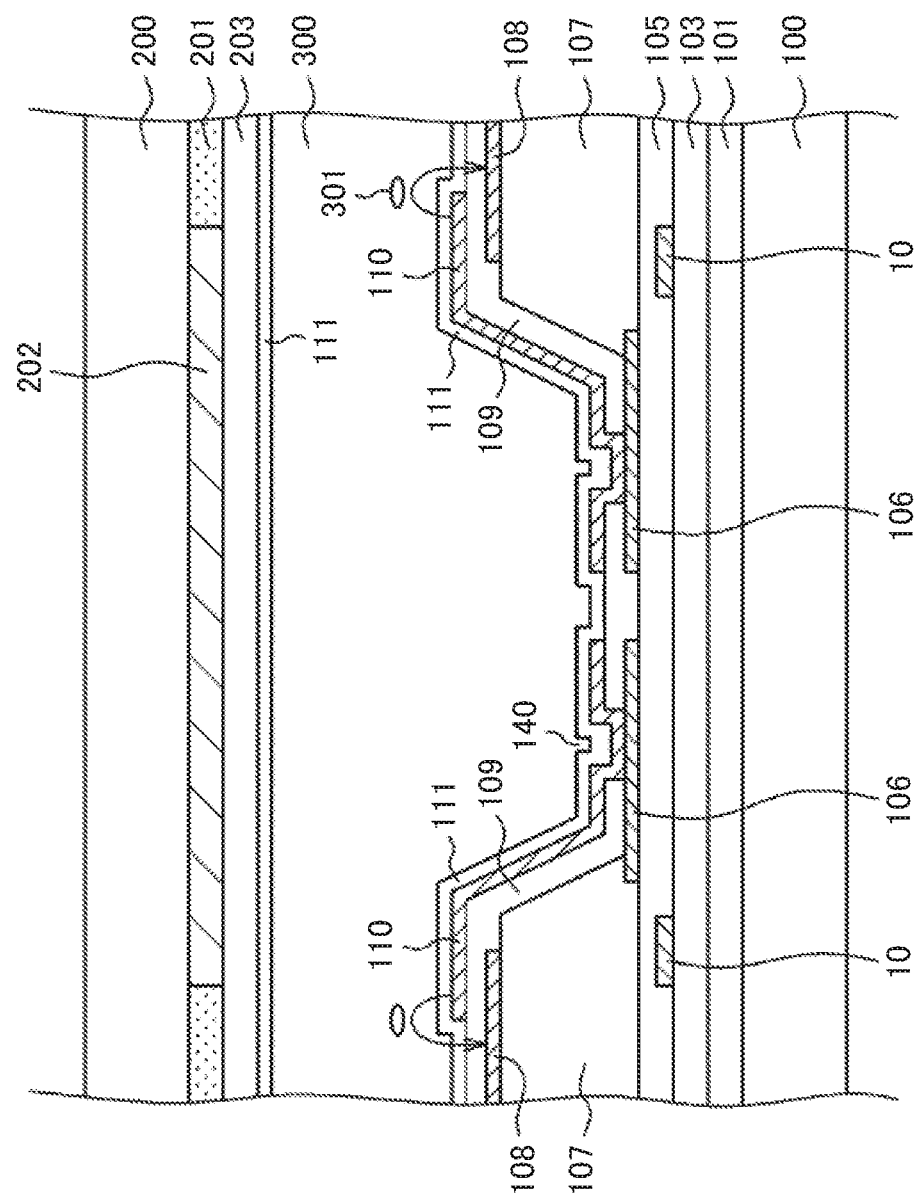
FIG. 4 is cross sectional view along the line A-A of FIG. 3.

FIG. 4 is cross sectional view along the line A-A of FIG. 3. In FIG. 4, the undercoat 101 is formed on the TFT substrate 100. The undercoat 101 prevents the semiconductor layer 102 from being contaminated by impurities from the TFT substrate 100 that is formed by e.g. glass. As described in FIG. 3, the semiconductor layer 102 is formed on the undercoat 101; however, the semiconductor layer 102 doesn't exist in FIG. 4. In FIG. 4, the gate insulating film 103 is formed on the undercoat 101; the scanning line 10 is formed on the gate insulating film 103; the interlayer insulating film 105 is formed on the scanning line 10.

In FIG. 4, contact electrode 106 and the organic passivation film 107 are formed on the interlayer insulating film 105. The contact electrode 106 has a role to connect the TFT and the pixel electrode 110. The contact electrode 106 is formed by the same material as the video signal line 20 and simultaneously formed as the video signal line 20. The organic passivation film 107 covers the scanning line 10; however, it doesn't cover most of the contact electrode 106.

The common electrode 108 is formed in a solid plane shape on the organic passivation film 107. The common electrode 108 is formed up to a vicinity of the edge of the upper surface of the organic passivation film 107. The capacitance insulating film 109 is formed by silicon nitride covering the common electrode 108. The capacitance insulating film 109 covers the connection area as well as the organic passivation film 107. The pixel electrode 110 is formed on the capacitance insulating film 109. When a voltage is applied to the pixel electrode, a line of electric force is generated as noted by the arrow in FIG. 4 at the slit 1101 and at the edge of the pixel electrode 110. The line of force goes from the pixel electrode 110 to the common electrode 108 through the liquid crystal layer 300; thus, liquid crystal molecules 301 are rotated to control a transmittance of light, consequently, images are formed.

The through hole 140 is formed in the capacitance insulating film 109 in the connection area; the pixel electrode 110 and the contact electrode 106 are connected in the through hole 140. The feature of FIG. 4 is that the organic passivation film 107 doesn't exist at the through hole 140; thus, the diameter of the through hole 140 can be made small. Therefore, the area of the pixel for images can be enlarged, consequently, a transmittance of the liquid crystal display panel increases. The alignment film 111, which is for initial alignment of the liquid crystal molecules 301, is formed covering the pixel electrode 110.

In FIG. 4, the counter substrate 200 is set opposing to the TFT substrate 100 with sandwiching the liquid crystal layer 300. The color filter 201 and black matrix 202 are formed on the inside of the counter substrate 200. The color filter 201 corresponds to the pixel area while the black matrix corresponds to the connection area. The overcoat film 203 is formed covering the color filter 201 and the black matrix 202. The overcoat film prevents the pigments of the color filter 201 from oozing out to contaminate the liquid crystal 300. The alignment film 111 is formed on the overcoat film 203.

The structure of FIG. 4 enables to decrease the diameter of the through hole 140, thus, the width of the black matrix 201 can be narrower. Consequently, the pixel area for images can be enlarged, and the transmittance can be increased. Further, two connection areas are integrated in one, thus, numbers of the stripes of black matrix can be half; therefore, the transmittance of the display panel is further improved.

Figure 5:
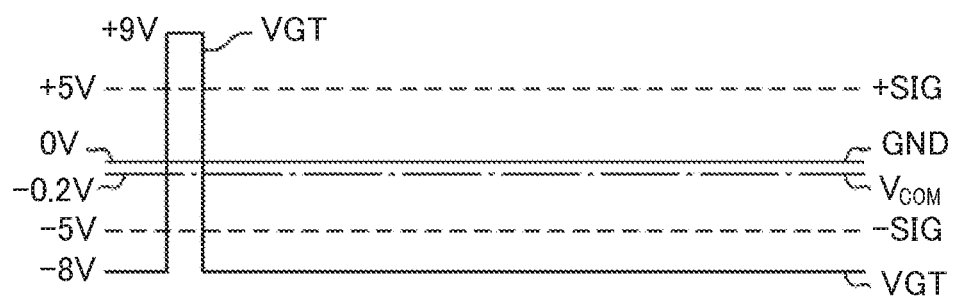
FIG. 5 is an example of a gate voltage.

The other feature of the present invention is that the gate voltage that is applied to the scanning line 10 can easily penetrate into the liquid crystal layer 300 since the recess of the organic passivation film 107 is formed in the connection area. FIG. 5 is an example of voltages applied to several electrodes when the Poly-Si is used as the semiconductor layer and the TFT is a top gate type as depicted in FIGS. 3 and 5. In FIG. 5, GND is a ground potential, +SIG is a maximum of the video signal and —SIG is a minimum of the video signal. The polarities of the video signals, which are applied to the pixel electrode, are changed periodically. Vcom is a voltage that is applied to the common electrode, and is generally constant. VGT is a voltage applied to the gate electrode, and is generally −8V; VGT becomes +9V only when the TFT is set ON.

Figure 6:
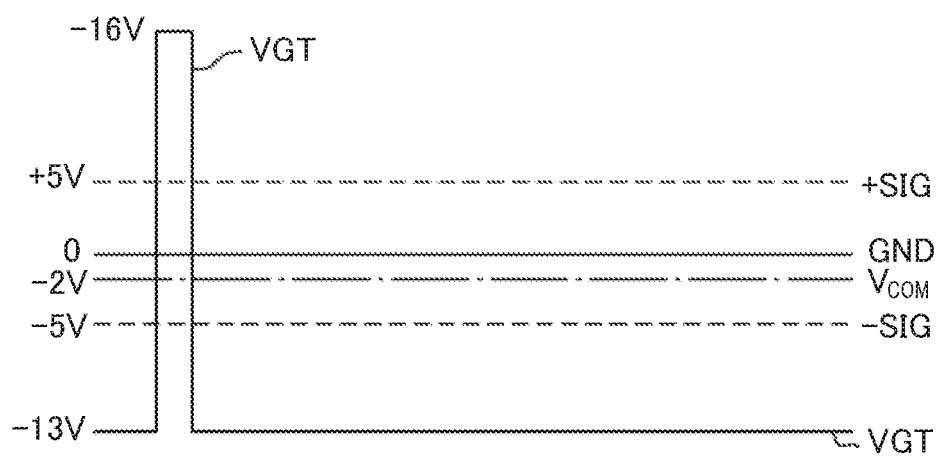
FIG. 6 is another example of a gate voltage.

FIG. 6 is an example of voltages applied to several electrode when the a-Si is used as the semiconductor layer and the TFT is a bottom gate type. In FIG. 6, GND is a ground potential, +SIG is a maximum of the video signal and −SIG is a minimum of the video signal. The polarities of the video signals, which are applied to the pixel electrode, are changed periodically. Vcom is a voltage that is applied to the common electrode, and is generally constant. VGT is a voltage applied to the gate electrode, and is generally −13V; VGT becomes +16V only when the TFT is set ON.

As depicted in FIGS. 5 and 6, the voltage applied to each of the scanning line 10 is generally a big minus voltage except when the scanning line 10 is selected. In other words, the scanning line 10 is in minus voltage most of the time. In the present invention, as depicted in FIG. 4, a recess of the organic passivation film 107 is formed; thus, the voltage applied to the scanning line (gate voltage herein after) 110 can easily penetrate into the liquid crystal layer 300, consequently, the plus ions are effectively trapped by the scanning line 10. This area is formed in each of the pixels, thus, ions don't concentrate at a specific area; consequently, display unevenness can be avoided.

Figure 7:
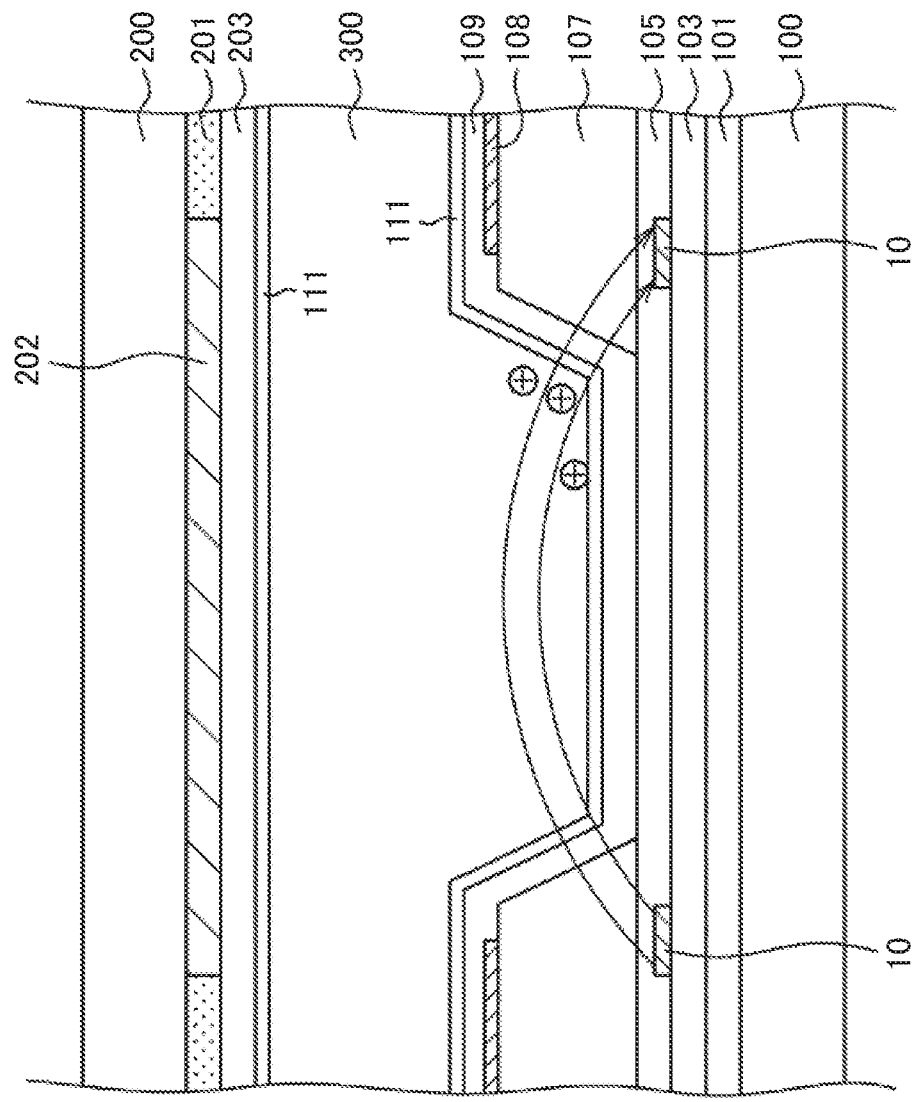
FIG. 7 is cross sectional view along the line B-B of FIG. 3.
Figure 8:
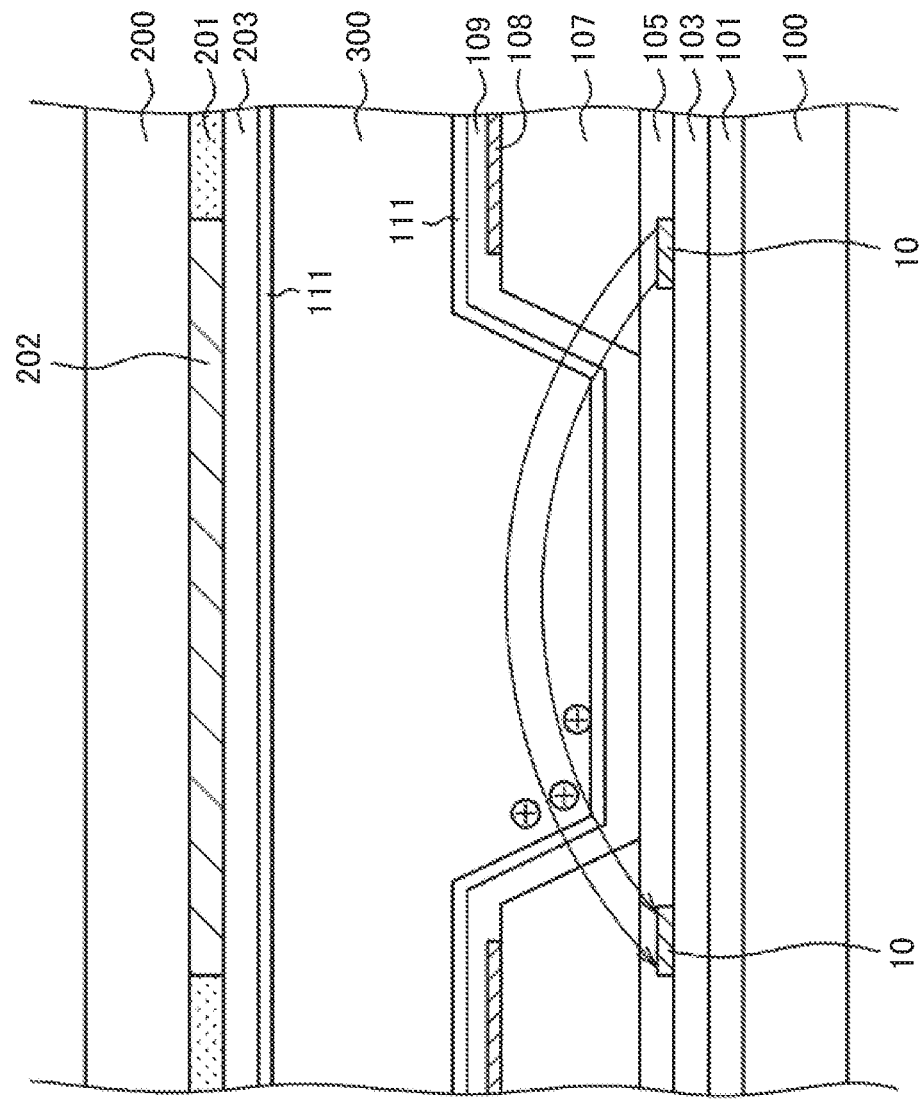
FIG. 8 is another cross sectional view along the line B-B of FIG. 3.

Yet another feature of the present invention is that: AC voltage, which is lower than the gate voltage VGT in absolute value, is superimposed on the gate voltage to increase the effect of ion trapping. FIGS. 7 and 8, which correspond to cross sectional view along the B-B line of FIG. 3, explain this function. The left scanning line 10 of FIG. 7 corresponds to the upper scanning line of FIG. 3; the right scanning line 10 of FIG. 7 corresponds to the lower scanning line of FIG. 3.

A big minus voltage is applied to the scanning lone 10 when it is not selected. In the present invention, an AC voltage, which doesn't open the gate, is applied between the adjacent scanning lines 10 to increase the effect of ion trapping.

FIG. 7 shows that higher voltage is applied to the left scanning line 10 than the right scanning line 10. In this state, the plus ions are gathered at the right side of the recess, namely, the ions are gathered at the side that potential is lower. FIG. 8 shows that higher voltage is applied to the right scanning line 10 than the left scanning line 10. In this state, the plus ions are gathered at the left side of the recess, namely, the ions are gathered at the side that potential is lower. In any event, the plus ions are trapped and stay in the recess of the organic passivation film.

FIG. 9 is an example of a gate voltage applied to the scanning line 10 according to the present invention. FIG. 9 corresponds to the gate voltage of FIG. 5. The scanning lines 10 are selected sequentially from the top of the screen. The gate voltage applied to the upper scanning line 10 of FIG. 3 is an upper waveform of FIG. 9; the gate voltage applied to the lower scanning line 10 of FIG. 3 is a lower waveform of FIG. 9. Namely, the upper VGT and the lower VGT deviate for a scanning period (a period that the gate voltage is applied to each of the scanning lines), in other words, for a video data writing period.

In FIG. 9, the voltage when the scanning line is selected is 9V. On the other hand, the voltage when the scanning line is not selected is −8V; however, in the present invention, AC voltage of crest value VA is superimposed as depicted in FIG. 9. The crest voltage of AC voltage is selected to a value that doesn't open the gate. In the upper figure of FIG. 9, the voltage when the scanning line 10 is not selected is VGT1; in the lower figure of FIG. 9, the voltage when the scanning line 10 is not selected is VGT2.

Consequently, a voltage of VGT1−VGT2=2VA is generated between the upper scanning line and the lower scanning line; thus, a line of force as depicted in FIGS. 7 and 8 is generated. The period T of the AC voltage can be chosen widely since the purpose of applying AC voltage is to avoid concentration of ions at one place in the recess of the organic passivation film 107. For example the period can be chosen from the scanning period to the frame period. On the other hand, the crest value of the AC voltage must be limited not to open the gate at the plus side; concretely, the superimposed gate voltage should not be higher than the common voltage Vcom.

As described above, the structure of the present invention can trap ions effectively; thus, the present invention can prevent the black stain due to aggregation of ions. In addition, in the present invention, the diameter of the through hole to connect the pixel electrode and the TFT can be made small, thus, a transmittance of the liquid crystal display panel can be increased. Further, the black matrix extends along the scanning line can be made one per two pixel rows, thus, a transmittance of the liquid crystal display panel can be increased.

Second Embodiment

Figure 10:
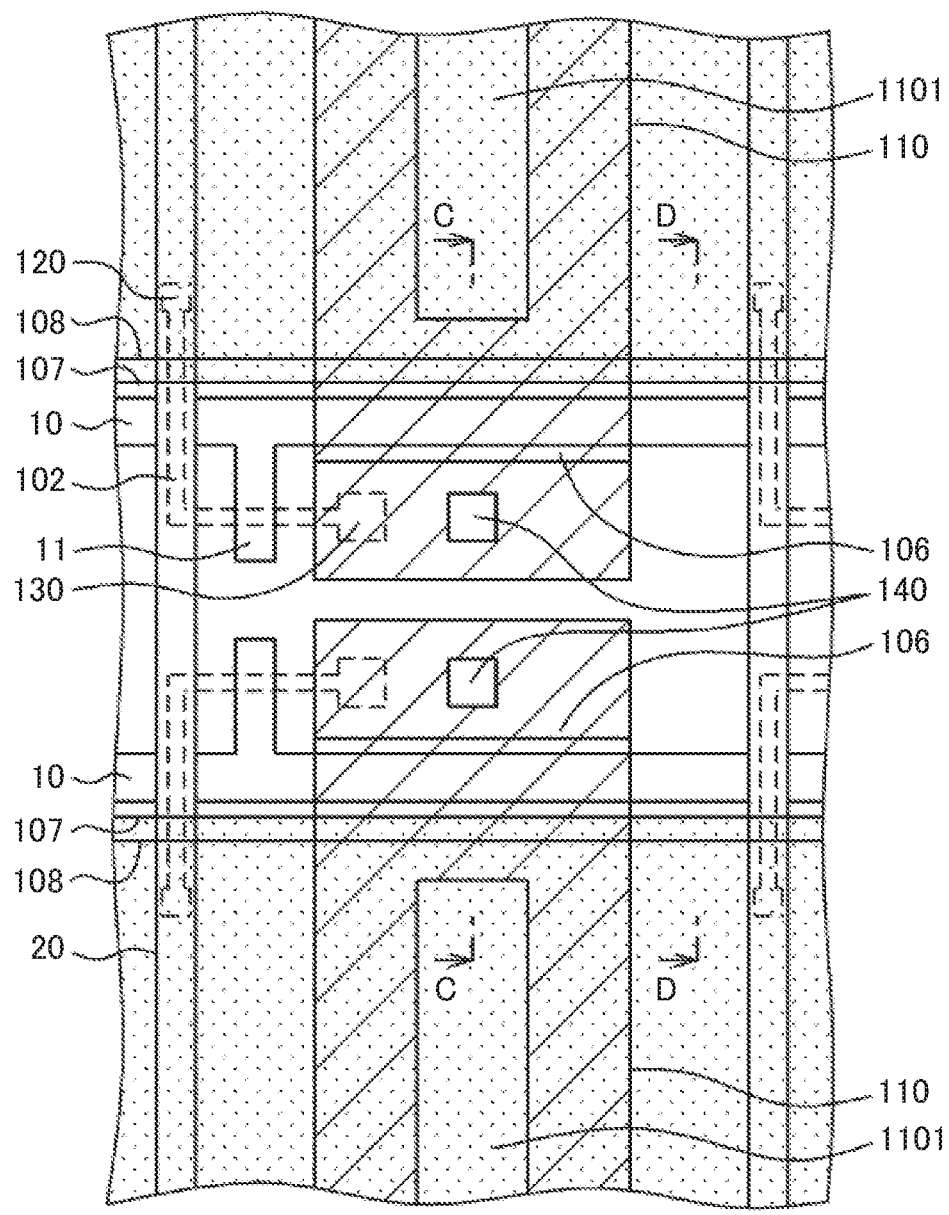
FIG. 10 is a plan view of the pixel configuration in the display area according to embodiment 2.

FIG. 10 is a plan view of the second embodiment. FIG. 10 differs from FIG. 3 in that the edge of the organic passivation film 107 retreats to the pixel area than the scanning line 10. Accordingly, the edge of the common electrode 108, which is formed on the organic passivation film 107, also retreats to the pixel area. In this structure, the scanning line 10 is not covered by the organic passivation film 107, thus, ion trapping effect by the scanning line 10 is further improved.

Figure 11:
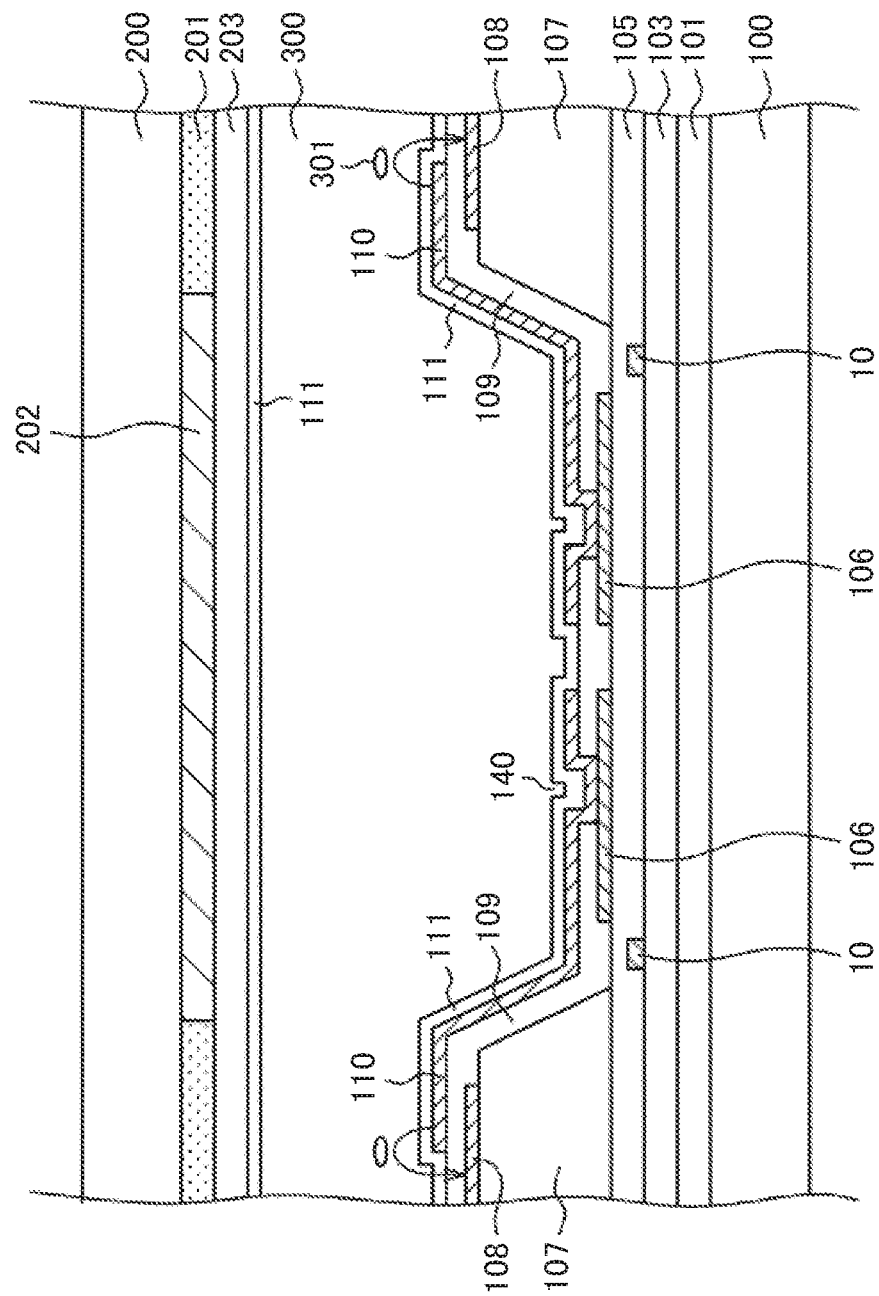
FIG. 11 is cross sectional view along the line C-C of FIG. 10.

FIG. 11 is cross sectional view along the line C-C of FIG. 10. FIG. 11 differs from FIG. 4 in that the scanning line 10 is not covered by the organic passivation film 107. Accordingly, the width of the recess of the organic passivation film becomes wider; consequently, the width of the black matrix becomes wider, too.

Since the scanning line 10 is not covered by the organic passivation film 107, the influence of the gate voltage that penetrates into the liquid crystal becomes stronger; thus, the ion trapping effect is intensified. In this embodiment, too, applying AC voltage between the adjacent scanning lines 10 can further improve the ion trapping effect, which is the same as explained in the first embodiment.

Figure 12:
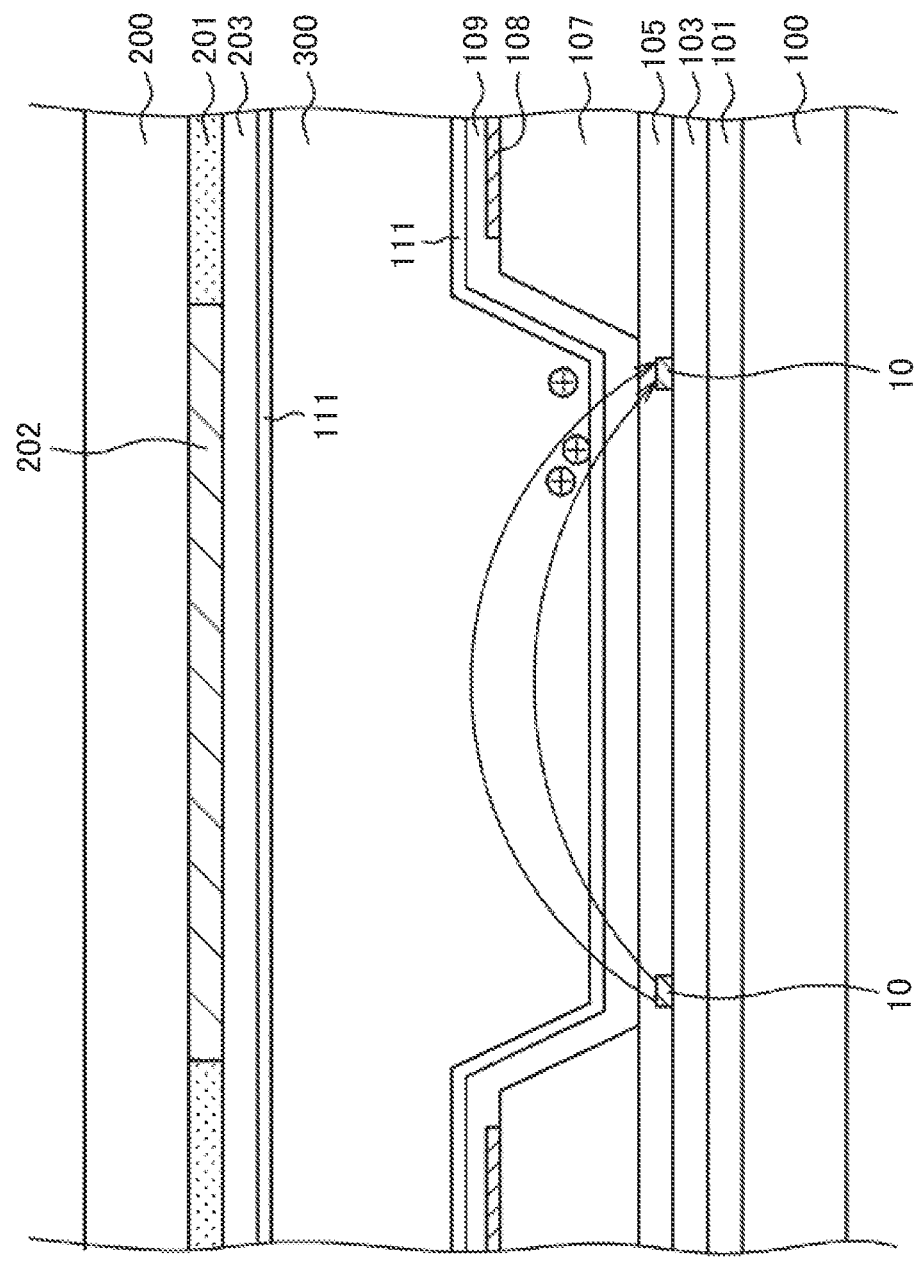
FIG. 12 is cross sectional view along the line D-D of FIG. 10.
Figure 13:
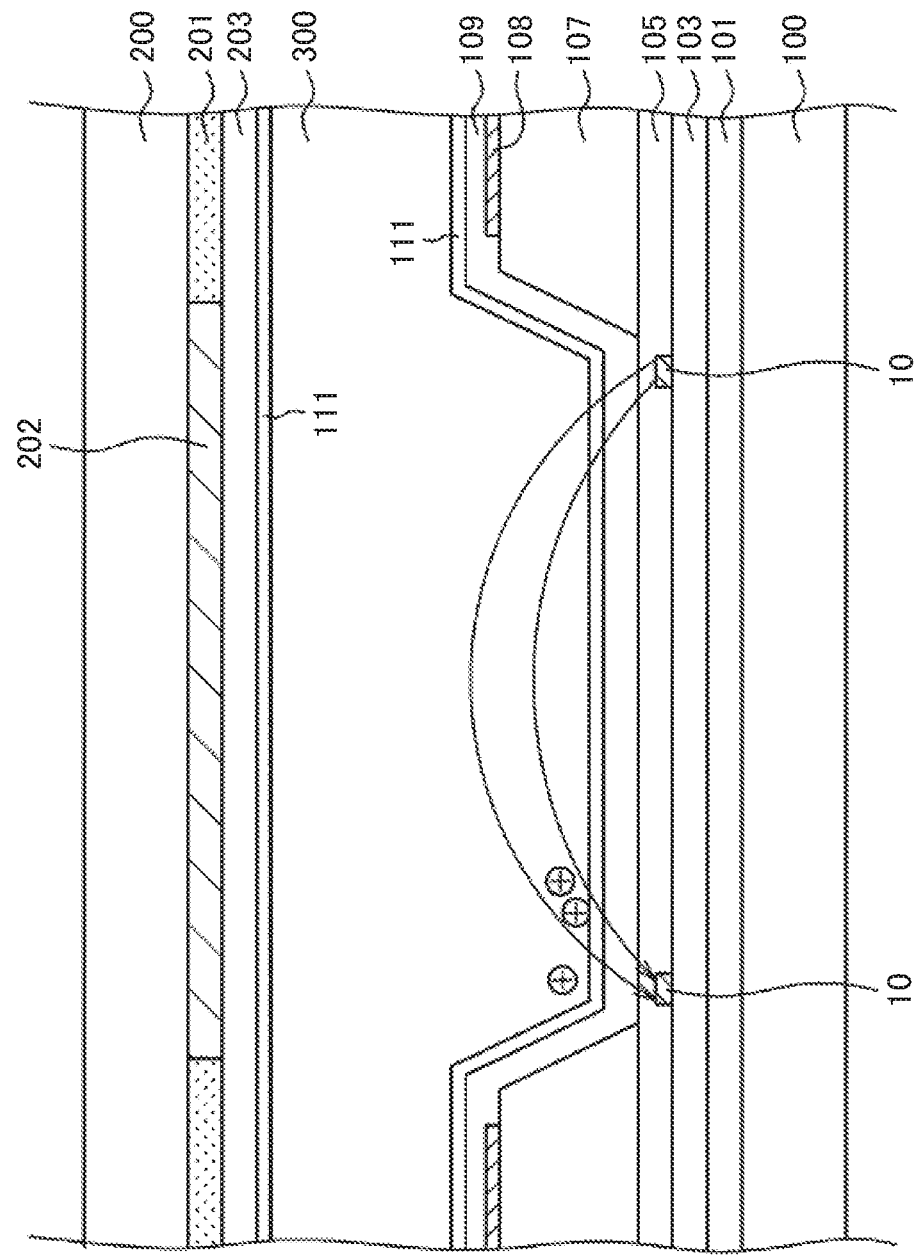
FIG. 13 is another cross sectional view along the line D-D of FIG. 10.

FIGS. 12 and 13 are cross sectional views along the line D-D of FIG. 10. FIGS. 12 and 13 differ from FIGS. 7 and 8 in that the organic passivation film 107 and the common electrode 108 don't cover the scanning line 10. Consequently, the influence of the gate voltage becomes stronger in the recess of the organic passivation film 107. As explained in the first embodiment, in this embodiment, too, AC voltage as shown in FIG. 9 is applied to the scanning lines 10.

FIG. 12 shows that higher voltage is applied to the left scanning line 10 than the right scanning line. In this state, the plus ions are gathered at the vicinity of the right scanning line 10. The influence of the gate voltage in the recess in FIG. 12 is stronger than that of in FIG. 7; thus ion trapping effect is improved.

FIG. 13 shows that higher voltage is applied to the right scanning line 10 than the left scanning line. In this state, the plus ions are gathered at the vicinity of the left scanning line 10. The influence of the gate voltage in the recess in FIG. 13 is stronger than that of in FIG. 8; thus ion trapping effect is improved.

In this embodiment, the width of the recess of the organic passivation film is wider, thus, width of the black matrix 202 is wider than in the first embodiment, consequently, a light transmittance of the liquid crystal display panel is decreased; however, ion trapping effect is stronger than that of the first embodiment. In this embodiment, too, the diameter of the through hole 140 to connect the pixel electrode 110 and the contact electrode 106 can be made small, thus, a transmittance of the liquid crystal display panel can be increased. Further, the black matrix that extends along the scanning line can be made one per two pixel rows, thus, a transmittance of the liquid crystal display panel can be increased.

Third Embodiment

Figure 14:
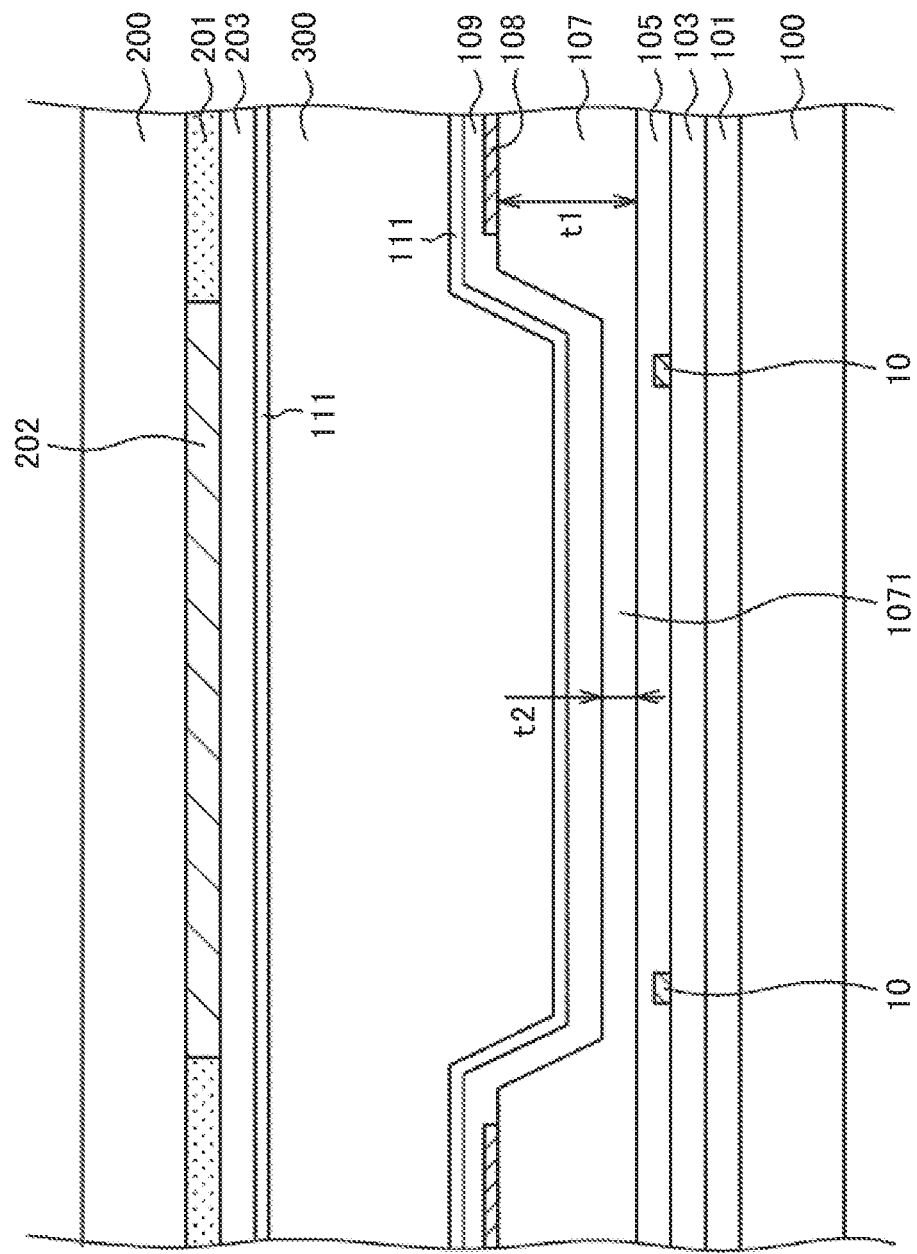
FIG. 14 is a cross sectional view of embodiment 3.

FIG. 14 is a cross sectional view of the third embodiment of the present invention, which corresponds to cross sectional view along the line B-B of FIG. 3 of the first embodiment. In embodiments 1 and 2, in the recess, where the control area (the connection area) exists, the organic passivation film is completely removed; in FIG. 14, however, a thin organic passivation film exists in the recess.

The structure of FIG. 14 can be made by applying a half tone exposure to the organic passivation film 107. In FIG. 14, given that t1 is a thickness of the organic passivation film 107 and t2 is a thickness of the thin organic passivation film in the recess, the relation between t1 and t2 is se as t2<t1, and preferably, t2≤t1/2. A diameter of the through hole in the organic passivation film of a thickness t2 is smaller than a diameter of the through hole in the organic passivation film of a thickness t1, thus, a decrease of light transmittance caused by the through hole can be suppressed. Besides, as explained in the first embodiment, in the third embodiment, too, the black matrix extends along the scanning line can be made one per two pixel rows, thus, a transmittance of the liquid crystal display panel can be increased.

In addition, in the third embodiment, too, ions can be effectively trapped in the recess as explained in the first embodiment. Further, in the third embodiment, too, ion trapping can be further improved by applying AC voltage between the adjacent scanning lines 10 as explained in the first embodiment.

By the way, FIG. 14 corresponds to cross section along the line B-B of FIG. 3 of the first embodiment; however, the structure of the third embodiment can also be applied to the second embodiment.

In the above explanations, the recess formed in the organic passivation film 107 is formed continuously along the scanning line 10; however, the organic passivation film 107 can be removed from the pixel area, and remain only on the video signal lines that separate pixels in lateral direction. In this case, the recesses of the organic passivation film exist at intervals.

In the above explanations, in the pixel area, the common electrode is formed on the organic passivation film and the pixel electrode is formed above the common electrode sandwiching the capacitance insulating film. The present invention, however applicable to the structure that the pixel electrode is formed on the organic passivation film and the common electrode is formed above the pixel electrode sandwiching the capacitance insulating film.

Further, the present invention is applicable not only to the IPS type liquid crystal display device but also is applicable to other types of liquid crystal display devices.

What is claimed is:

1. A liquid crystal display device comprising:
a TFT substrate and a counter substrate adhered by a seal formed in a periphery of the TFT substrate and the counter substrate, wherein a liquid crystal layer is sandwiched between the TFT substrate and the counter substrate, and a display area;
a pair of a first scanning line and a second scanning line extending in a first direction on the TFT substrate, and a first pixel having a first pixel electrode and a second pixel having a second pixel electrode are formed between the pairs of the scanning lines, wherein a connection area is formed between the first scanning line and the second scanning line;
a first TFT, a first through hole that connects the first TFT with the first pixel electrode, a second TFT, and a second through hole that connects the second TFT with the second pixel electrode, wherein the first TFT, the first through hole, the second TFT, and the second through hole are formed in the connection area;
wherein
the first pixel electrode and the second pixel electrode are formed on an organic passivation film,
the organic passivation film is not formed in an area where the first through hole and the second through hole are formed, and
an AC voltage of reverse phase superimposed on a DC voltage is applied to the first scanning line and the second scanning line.

2. The liquid crystal display device according to claim 1, wherein the AC voltage is a pulse wave that the first TFT and the second TFT are not set ON.

3. The liquid crystal display device according to claim 1, wherein a period of the AC voltage is longer or same as a time the scanning line is selected, and shorter or same as a frame period.

4. The liquid crystal display device according to claim 1, wherein a black matrix is formed on the counter substrate, the black matrix covers the connection area in a plan view.

5. A liquid crystal display device comprising:
a TFT substrate and a counter substrate adhered by a seal formed in a periphery of the TFT substrate and the counter substrate, wherein a liquid crystal layer is sandwiched between the TFT substrate and the counter substrate, and a display area;
a pair of a first scanning line and a second scanning line extending in a first direction on the TFT substrate, and a first pixel having a first pixel electrode and a second pixel having a second pixel electrode are formed between the pairs of the scanning lines, wherein a connection area is formed between the first scanning line and the second scanning line;
a first TFT, a first through hole that connects the first TFT with the first pixel electrode, a second TFT, and a second through hole that connects the second TFT with the second pixel electrode, wherein the first TFT, the first through hole, the second TFT, and the second through hole are formed in the connection area;
wherein
the first pixel electrode and the second pixel electrode are formed on an organic passivation film,
the organic passivation film is not formed in an area where the first through hole and the second through hole are formed, and the area that the organic passivation film doesn't exist in the connection area is continuously formed in the first direction.

6. A liquid crystal display device comprising:
a TFT substrate and a counter substrate adhered by a seal formed in a periphery of the TFT substrate and the counter substrate, wherein a liquid crystal layer is sandwiched between the TFT substrate and the counter substrate, and a display area;
a pair of a first scanning line and a second scanning line extending in a first direction on the TFT substrate, and a first pixel having a first pixel electrode and a second pixel having a second pixel electrode are formed between the pairs of the scanning lines, wherein a connection area, which controls the first pixel and the second pixel, is formed between the first scanning line and the second scanning line;
a first TFT, a first through hole that connects the first TFT with the first pixel electrode, a second TFT, and a second through hole that connects the second TFT with the second pixel electrode, wherein the first TFT, the first through hole, the second TFT, and the second through hole are formed in the connection area;
wherein
the first pixel electrode and the second pixel electrode are formed on an organic passivation film of a first thickness,
the first through hole and the second through hole are formed in an organic passivation film of a second thickness,
the second thickness is less than the first thickness, and
an AC voltage of reverse phase superimposed on a DC voltage is applied to the first scanning line and the second scanning line.

7. The liquid crystal display device according to claim 6, wherein the AC voltage is a pulse wave that the first TFT and the second TFT are not set ON.

8. The liquid crystal display device according to claim 6, wherein a period of the AC voltage is longer or same as a time the scanning line is selected, and shorter or same as a frame period.

9. A liquid crystal display device comprising:
a TFT substrate and a counter substrate adhered by a seal formed in a periphery of the TFT substrate and the counter substrate, wherein a liquid crystal layer is sandwiched between the TFT substrate and the counter substrate, and a display area;
a pair of a first scanning line and a second scanning line extending in a first direction on the TFT substrate, and a first pixel having a first pixel electrode and a second pixel having a second pixel electrode are formed between the pairs of the scanning lines, wherein a connection area is formed between the first scanning line and the second scanning line;
a first TFT, a first through hole that connects the first TFT with the first pixel electrode, a second TFT, and a second through hole that connects the second TFT with the second pixel electrode, wherein the first TFT, the first through hole, the second TFT, and the second through hole are formed in the connection area;
wherein
the first pixel electrode and the second pixel electrode are formed on an organic passivation film,
the organic passivation film is not formed in an area between the first scanning line and the second scanning line in a plan view, and
an AC voltage of reverse phase superimposed on a DC voltage is applied to the first scanning line and the second scanning line.

10. The liquid crystal display device according to claim 9, wherein the area that the organic passivation film doesn't exist in the connection area is continuously formed in the first direction.

* * * * *